United States Patent [19]

Grunwell

[11] Patent Number: 5,499,392
[45] Date of Patent: Mar. 12, 1996

[54] FILTER HAVING A VARIABLE RESPONSE TIME FOR FILTERING AN INPUT SIGNAL

[75] Inventor: Randall L. Grunwell, Suwanee, Ga.

[73] Assignee: Matsushita Communication Industrial Corporation of America, Peachtree City, Ga.

[21] Appl. No.: 277,226

[22] Filed: Jul. 19, 1994

[51] Int. Cl.⁶ .......................... H03L 7/099; H03H 11/00; H04B 1/16

[52] U.S. Cl. .......................... 455/260; 455/76; 455/307; 455/340; 331/17; 333/174; 333/214

[58] Field of Search .................... 455/76, 259, 260–262, 455/266, 307, 339, 340; 333/174, 214; 331/17

[56] References Cited

U.S. PATENT DOCUMENTS

| | | |
|---|---|---|
| 3,611,168 | 10/1971 | Haggai . |
| 3,657,661 | 4/1972 | Jarger . |
| 3,702,405 | 11/1972 | Zwirn et al. ............................ 333/214 |
| 3,835,399 | 9/1974 | Holmes ................................... 333/214 |
| 4,093,824 | 6/1978 | GrosJean . |
| 4,156,195 | 5/1979 | GrosJean . |
| 4,479,091 | 10/1984 | Yoshisato ................................... 331/17 |
| 4,736,167 | 4/1988 | Kojima et al. . |
| 4,970,472 | 11/1990 | Kennedy et al. . |
| 5,068,626 | 11/1991 | Takagi et al. . |
| 5,126,692 | 6/1992 | Shearer et al. . |
| 5,144,156 | 9/1992 | Kawasaki . |
| 5,392,456 | 2/1995 | Mitomo et al. ............................ 455/307 |

FOREIGN PATENT DOCUMENTS 2-295214  12/1990  Japan ...................................... 333/214

Primary Examiner—Reinhard J. Eisenzopf
Assistant Examiner—Chi H. Pham
Attorney, Agent, or Firm—Jones & Askew

[57] ABSTRACT

A tunable filter (25) is described for use in loop control circuits. The filter (25) has a time constant which is determined by a resistor (40) and a capacitor. The capacitor is simulated by the series combination of an impedance converter (41) and a variable resistor, such as a field effect transistor (42). The resistance of the transistor (42) is determined by a control signal present on a control line (32) and the impedance converter (41) converts the resistance into an equivalent capacitive reactance. Therefore, the control signal on the control line (32) effectively controls the capacitance present at a node (43) and, in conjunction with the resistor (40), determines the time constant, and therefore the response time and bandwidth, of the filter (25). Multiple pole, lowpass, bandpass, highpass, and bandstop filters can be constructed. The impedance converter (41) uses a very small capacitor to simulate a large capacitance value at the node (43). This small capacitance value also allows the filter (25) to be fabricated as part of an integrated circuit.

14 Claims, 5 Drawing Sheets

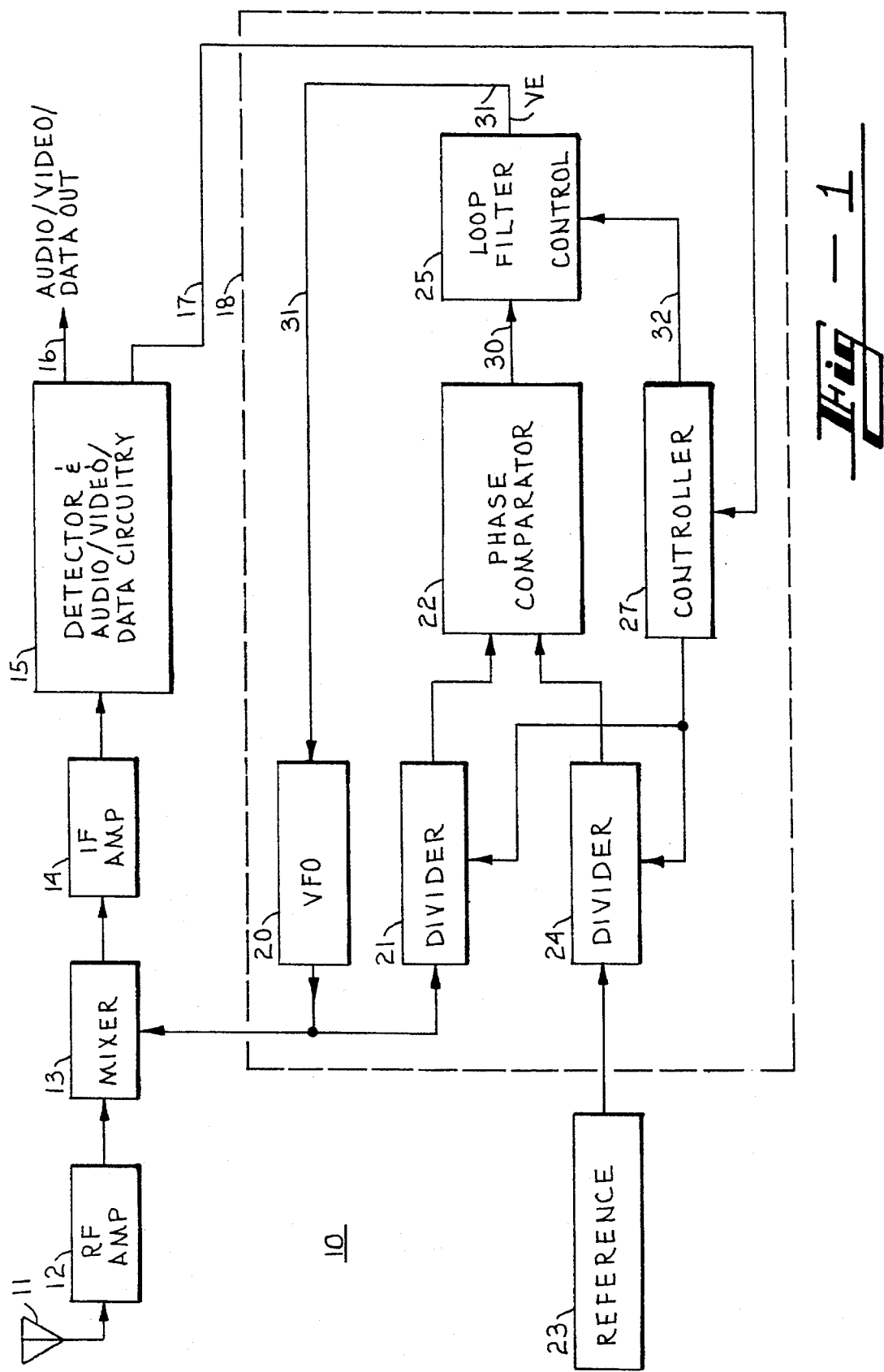

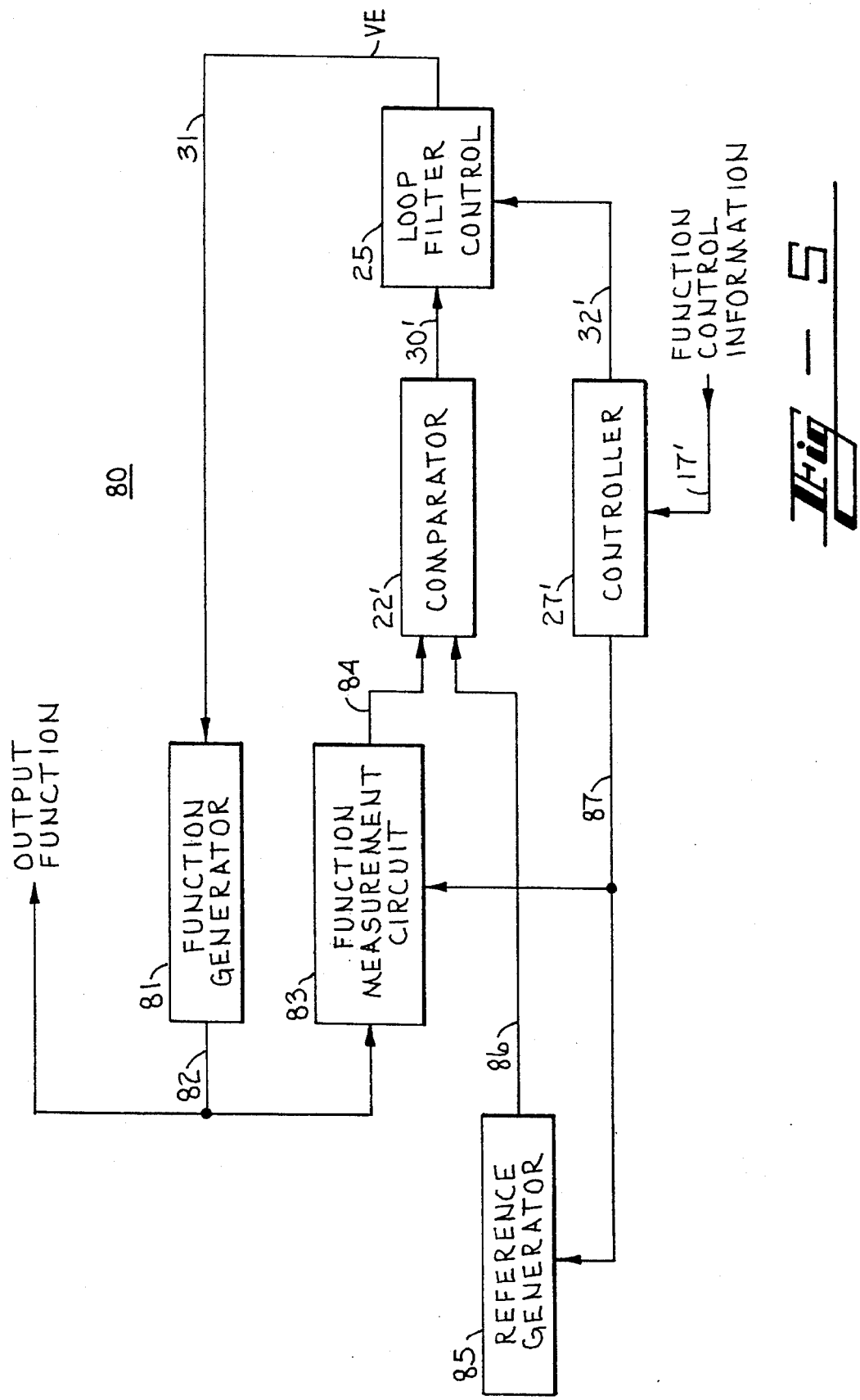

FILTER HAVING A VARIABLE RESPONSE TIME FOR FILTERING AN INPUT SIGNAL

TECHNICAL FIELD

The present invention relates to filters and, more particularly, to a loop filter having a variable response time.

BACKGROUND OF THE INVENTION

One example of a control loop is a phase-locked loop. A typical phase-locked loop oscillator circuit has a variable frequency oscillator (VFO), such as a voltage controlled oscillator, a divider or prescaler for dividing the variable frequency output of the VFO down to a desired frequency or band, a phase comparator for comparing the phase of the frequency-divided VFO signal with the phase of a reference signal, which may also be frequency-divided, and a loop filter for low pass filtering the output of the phase comparator so as to provide an error signal to the VFO, thereby causing the VFO to achieve the desired oscillation frequency. The reference signal may be a locally generated reference, such as the output of a crystal oscillator, or may be a remotely generated reference, such as a received phase, frequency or amplitude modulated signal. With the exception of the loop filter, the general design of a phase-locked loop oscillator is straightforward and well known in the art.

The design of a loop filter is a tradeoff between two opposing goals: lock time, and stability. The response time of a loop filter determines how quickly a function generator can lock to the reference signal when the reference signal or some other parameter changes. A fast response calls for a small time constant, and therefore a higher cutoff frequency, for the loop filter. Once lock has been achieved then the function generator should be very stable. However, a fast lock typically means that the function generator is very susceptible to noise. In most cases a compromise is made between these two divergent goals and the response time of the loop filter is set so that the output of the function generator is reasonably stable but the output of the function generator will lock to the reference signal within an acceptable time.

In one type of function generator, a VFO, the reference signal may change frequency, or the frequency divider ratio may be changed so as to generate a different VFO output frequency. It is generally desirable, especially when the reference signal is remotely generated, to cause the VFO to quickly lock to the reference signal and to accurately and quickly track any changes in the frequency of the reference signal, hence a fast response time is desired. However, in some applications, such as a demodulator, it is desirable that the VFO frequency not precisely follow the reference frequency but only follow variations in the average of the frequency of the reference signal. These factors call for a loop filter with a slower response time, which means that a lower cutoff frequency is desired.

One approach to achieving both goals is to vary the response time of the loop filter. In the past, varying the response time for the loop filter has been accomplished by switching capacitors in and out of the loop filter or by changing the resistance in the loop filter. For example, see U.S. Pat. Nos. 3,657,661 to Jarger, 4,093,824 to Grosjean, and 4,479,091 to Yoshisato.

However, switching components into and out of a circuit can introduce noise and cause spurious output function changes, such as frequency shifting. Furthermore, although the theoretical resistance range of a semiconductor device is quite large, the useful range is significantly smaller. This range limitation has the effect of determining the value of the capacitor which must be used in the loop filter. Generally, the capacitor is quite large and expensive, thereby increasing cost and space requirements, and cannot be manufactured as part of an integrated circuit.

Therefore, there is a need for a loop filter which has a variable response time and which does not require switching components in and out of the loop filter. It would also be desirable to eliminate the need for a large value (and therefore typically large size and cost) discrete capacitor in the loop filter. This also allows the control loop to be constructed as an integrated circuit.

These same limitations apply to loop filters used in other circuits as well. For example, the loop filter in an automatic gain control circuit should have a response time which allows for compensation of normal signal strength variations but which does not respond so rapidly as to counteract the modulation caused by the information which is being transmitted. Likewise, the loop filter in an automatic frequency control (AFC) circuit must allow the AFC circuit to compensate for normal frequency and phase drifting and shifting but must not allow the AFC circuit to act so quickly as to remove the transmitted information.

SUMMARY OF THE INVENTION

The present invention provides for filters which have a variable response time. Single- and multiple-pole, lowpass, bandpass, and highpass filters are provided, for both passive and active circuits. The lowpass filter has a variable response time (variable cutoff frequency) for filtering an input signal to provide a filtered output signal, and comprises a resistor having a first terminal connected to the input signal and a second terminal for providing the filtered output signal, and a series circuit connected between the second terminal and a signal return. The series circuit comprises an impedance converter connected in series with a variable resistor. The variable resistor has a resistance responsive to a response control signal. The impedance converter changes the variable resistance presented by the variable resistor into a variable capacitance. The variable capacitance, in conjunction with the other resistor, provides for a variable time constant, and therefore a variable response time and filter bandwidth. This allows the filter response to be varied as the need arises.

In the preferred embodiment, the variable resistor comprises a field effect transistor.

One embodiment of the present invention is a phase-locked loop. The phase-locked loop has a variable response time and comprises a variable frequency oscillator (VFO) for providing an oscillator signal having a frequency responsive to an error signal, a phase comparator functionally connected to a reference signal and to the oscillator signal for providing a phase comparison signal, and a filter having a variable cutoff frequency for filtering the phase comparison signal to provide the error signal. The filter comprises a resistor having a first terminal connected to the output of the phase comparator and a second terminal connected to the input of the variable frequency oscillator, and a series circuit connected between the second terminal and a signal return. The series circuit comprises an impedance converter connected in series with a variable resistor. The variable resistor has a resistance responsive to the response control signal. The phase-locked loop can be controlled to provide a fast response time when the VFO must be quickly moved to a new frequency, and to provide a slow response time when VFO stability is more important.

Another embodiment of the present invention is a frequency control or synthesis circuit, such as in a transmitter or a receiver. The receiver comprises: a mixer, connected to a received signal and to an oscillator signal, for providing an intermediate frequency (IF) signal responsive to the received signal and to the oscillator signal; an amplifier for providing an amplified IF signal; a detector for demodulating the amplified IF signal to provide a demodulated output signal; an oscillator for providing a reference signal; a variable frequency oscillator for providing the oscillator signal, the oscillator signal having a frequency responsive to an error signal; a phase comparator connected to the reference signal and the oscillator signal for providing a phase comparison signal; and a filter having a variable cutoff frequency for filtering the phase comparison signal to provide the error signal. The filter comprises a resistor having a first terminal connected to the output of the phase comparator and a second terminal connected to the input of the variable frequency oscillator, and a series circuit connected between the second terminal and a signal return. The series circuit comprises an impedance converter connected in series with a variable resistor. The variable resistance has a resistance responsive to the response control signal. The receiver can change frequencies quickly when necessary, such as when changing channels, and is stable once the new frequency or channel has been reached.

A transmitter constructed in accordance with the present invention comprises: an oscillator for providing a reference signal; a variable frequency oscillator for providing an oscillator signal, the oscillator signal having a frequency responsive to an error signal and a modulation signal; a phase comparator connected to the reference signal and the oscillator signal for providing a phase comparison signal; a filter having a variable cutoff frequency for filtering the phase comparison signal to provide the error signal, and means for processing the output from the variable frequency oscillator. This means may be, if necessary, a frequency multiplier for multiplying the frequency of the output of the variable frequency oscillator to achieve a desired frequency, and/or a power amplifier for amplifying the signal to provide the desired power level. The error signal and the modulation signal are summed to provide an input signal to the variable frequency oscillator. The frequency of the output of the variable frequency oscillator is therefore dependent upon the amplitude of the error signal and the amplitude of the modulation signal. However, the frequency of the modulation signal is substantially higher than the frequency of the error signal and the modulation signal has an average AC value of zero, and therefore the output of loop filter is essentially independent of the modulation signal and completely dependent upon the difference in frequency between the frequency of the variable frequency oscillator and the frequency of the reference. The filter in the transmitter is constructed in the same manner as the filter in the receiver, described briefly above. As a result, the transmitter can change frequencies quickly when necessary, such as when changing channels, and is stable once the new frequency or channel has been reached.

The response control signal specifies a fast or slow filter response and may be provided in response to a command to change channels.

In one embodiment the present invention has a controller which is connected to the detector and is responsive to information contained in the demodulated output signal for providing the response control signal.

In another embodiment of the present invention there is a frequency divider connected between the reference signal and the phase comparator for providing a reduced frequency reference signal to the phase comparator.

In another embodiment of the present invention there is a frequency divider connected between the oscillator signal and the phase comparator for providing a reduced frequency oscillator signal to the phase comparator.

In another embodiment of the present invention the controller is responsive to the information, such as a command to change channels, in the demodulated output signal for adjusting the divide ratio provided by the frequency divider.

In another embodiment of the present invention the information specifies a change in the operating channel for the receiver and the controller responds to the change exceeding a predetermined number of channels by causing the variable resistor to change its resistance value to provide a faster response time.

The present invention further provides that a change from a fast response time to a slow response time may be made in response to detection of a locked condition or in response to the passage of a predetermined amount of time.

In another embodiment of the present invention the response time may be variable over a large number of steps or be continuous, and vary in a linear or non-linear manner. Thus, the response time may be very fast when a change first occurs and becomes progressively slower as time passes or a lock is achieved.

The present invention also provides an apparatus for providing a predetermined function, such as a cruise control speed, a motor speed, a controlled position, etc. In general, the present invention provides: a reference generator for providing a reference signal; a function generator having an input for receiving an error signal and an output for providing the predetermined function, the predetermined function having at least one characteristic which is responsive to the error signal; a function measurement circuit having an input functionally connected to the output of the function generator, and an output for providing a function measurement signal which is responsive to the characteristic of the predetermined function; a comparator having a first input functionally connected to the reference signal and a second input functionally connected to the function measurement signal, and an output for providing a comparison signal; a means for a providing a response control signal; and a filter as described herein, having a variable cutoff frequency, for filtering the comparison signal to provide the error signal. In one version of generalized form, the filter is a lowpass filter and has a resistor having a first terminal connected to the output of the comparator and a second terminal connected to the input of the function generator, and has a series circuit connected between the second terminal and a signal return. The series circuit comprises a variable resistor connected in series with an impedance converter, the variable resistor having a control terminal connected to the response control signal, and having a resistance responsive to the response control signal. Therefore, the present invention has uses which are not limited to use in a conventional phase-locked loop circuit.

The present invention also discloses a highpass filter. The highpass filter comprises a series circuit having a first terminal connected to an input signal and a second terminal for providing a filtered output signal, a resistor connected between the second terminal and a signal return point, and means for providing a response control signal. The series circuit comprises a variable resistor connected in series with an impedance converter. The variable resistor has a control terminal and has a resistance which is responsive to the response control signal.

In addition, the present invention provides for combining one or more lowpass and/or highpass circuits of the present invention to provide for multiple-pole lowpass, bandpass, and highpass filters. The filters may be used as passive components or may be used as part of an active filter.

It will therefore be seen that the present invention is a filter which has a variable response time and is very useful in phase-locked loop circuits, automatic gain control circuits, automatic frequency control circuits, receivers, transmitters, and function generators in general.

BRIEF DESCRIPTION OF THE DRAWINGS

FIG. 1 is a block diagram of the present invention as used in a receiver.

FIG. 5 is a generalized implementation of the present invention.

DETAILED DESCRIPTION

Figure 3:
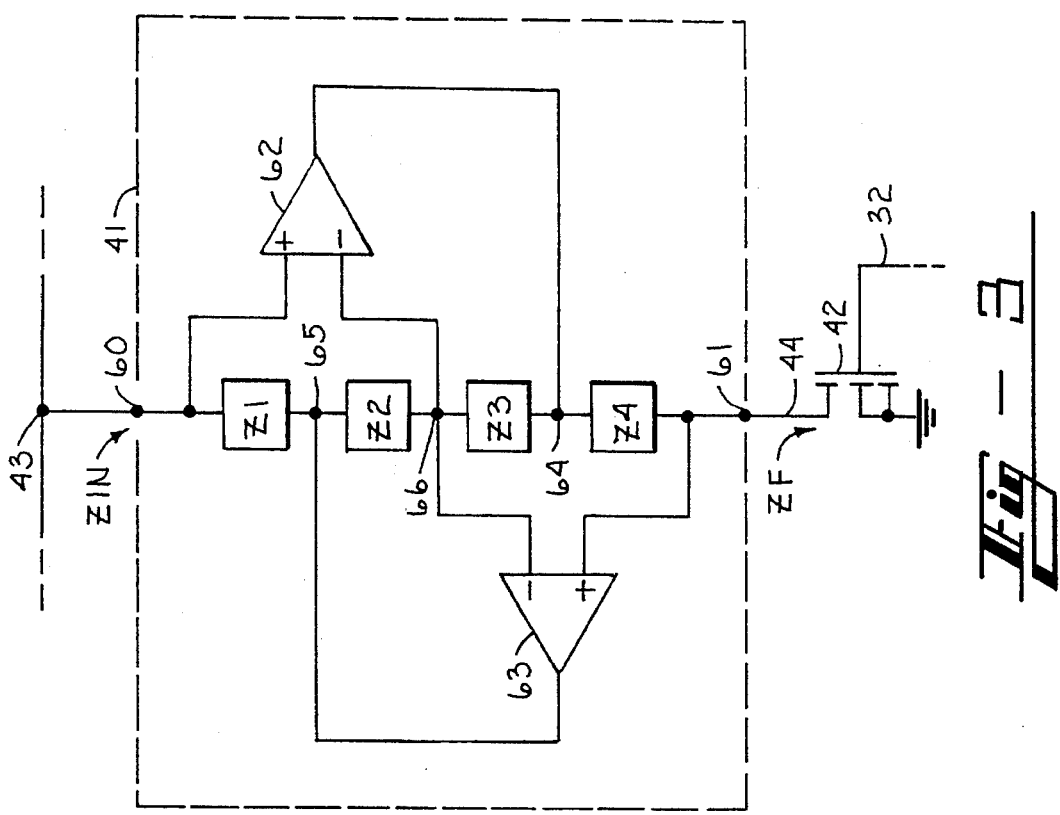
FIG. 3 is a schematic diagram of the impedance converter of the preferred embodiment of the present invention.

Turn now to the drawing in which like numerals represent like components throughout the several figures. FIG. 1 is a block diagram of the present invention as used in a receiver 10. Receiver 10 comprises an antenna 11, a radio frequency (RF) amplifier 12, a mixer 13, an intermediate frequency (IF) amplifier 14, a detector and audio/video/data circuitry 15, an audio/video/data output 16, and an oscillator 20 such as a variable frequency oscillator (VFO), which is preferably a voltage controlled oscillator (VCO). This much of receiver 10 is straightforward in design. That is, the received signal is captured by antenna 11, amplified by amplifier 12, mixed with the output of oscillator 20 in mixer 13 to produce an IF signal, which is amplified by IF amplifier 14, is detected by detector 15, and is then either used by audio/video/data circuitry 15 and/or provided as an audio/video/data output 16. The use of audio/video/data is intended in the nonexclusive alternate sense (and/or). For example, if receiver 10 is part of a pager then data, such as a caller telephone number or ID, may be displayed, a vibrator may be activated, or a tone may be outpulsed. If receiver 10 is part of a cellular telephone then output 16 will typically be an audio output. If receiver 10 is part of a television then output 16 may be a combination of audio, video and data. It also should be understood that the terms audio, video and data are examples of, and not limitations of, the types of information that may be used by or output by receiver 10.

A phase-locked loop oscillator circuit 18 preferably comprises VFO 20, dividers 21 and 24, a phase comparator 22, a loop filter 25, and a controller 27. The output of VFO 20 is provided to a divider or prescaler 21. The output of divider 21 is provided to one input of a phase comparator 22. A frequency reference 23, such as a crystal oscillator, provides a reference signal for setting the frequency of VFO 20. The output of reference 23 is provided to a divider or prescaler 24. The output of divider 24 is provided to a second input of phase comparator 22. Divider 21 and/or divider 24 may not be necessary, depending upon the frequency of the output of VFO 20 and reference 23, and the frequency limit of operation of phase comparator 22. However, to reduce costs and power consumption it is quite common to use a phase comparator 22 which has an upper frequency limit which is below that of the output of VFO 20 and/or reference 23 and therefore dividers 21 and 24 are used. The output of phase comparator 22 is provided to one input of the variable response loop filter 25. The error voltage (VE) output of loop filter 25 is provided to the frequency control input of VFO 20.

The divide ratios (scale factor) of dividers 21 and 24 are controlled by a controller 27. The divide ratio of one or both of dividers 21 and 24 will typically be changed when receiver 10 is changing channels. In an environment, such as a radio or television receiver, where the user can specify a change in channels then controller 27 will include means, such as a keypad, for allowing the user to specify the desired channel or a change in the channel. In cases where the user does not have control of the channel, such as in the cellular telephone environment, controller 27 will receive instructions from a Mobile Switching Center (MSC) (not shown) as to the desired channel. This information is conveyed to controller 27 via detector and audio/video/data circuitry 15. More particularly, the MSC will transmit a signal which will be processed by components 11–14, and demodulated by component 15. This control information is then output on signal path 17 to controller 27 to advise controller 27 of the desired change in channels.

Variations in the operation of the present invention are possible. In the preferred embodiment, controller 27 receives channel switching commands from the MSC via components 11–15 and the output of controller 27 is connected to the control input of loop filter 25. In this embodiment, if controller 27 is instructed to change channels and the new channel is more than a predetermined number of channels distant from the current channel, such as one or two channels distant in the preferred embodiment, then controller 27 will cause loop filter 25 to have a higher cutoff frequency (bandwidth), and therefore a faster response time, so that VFO 20 may be quickly tuned to the new desired frequency. Then, after a predetermined period of time, or lock detect, or some other criteria, controller 27 will cause loop filter 25 to have a lower cutoff frequency, thereby providing a slower response time and greater stability. This process provides for a rapid response time when changing channels so that VFO 20 quickly locks onto the new frequency and then a slower response time so that VFO 20 is stable and not adversely affected by noise.

In another embodiment, controller 27 will cause the loop filter 25 to have a cutoff frequency or response time proportional to the frequency difference between the current channel and the desired channel. Therefore, the greater the difference between the current channel and the desired channel, the greater the bandwidth of the filter and the faster the response time of the oscillator circuit 18. In other embodiments of the present invention, controller 27 may provide for multiple thresholds. That is, when a change in channels initially occurs controller 27 will cause filter 25 to have a fast response time and, as time progresses, controller 27 will progressively, preferably but not necessarily in steps, reduce the response time of loop filter 25 until loop filter 25 is at its slowest response time. In this embodiment the oscillator circuit 18 will initially shift frequencies very rapidly and then, as the output frequency approaches the desired output frequency, reduce the bandwidth so as to provide for an increasingly stable oscillator frequency.

It will be seen from the above that the present invention provides for a loop filter which has a response time which can be varied to accommodate varying conditions. Therefore, when a significant change in frequency is to be made the bandwidth of the loop filter 25 is increased so that VFO 20 may rapidly move and lock to the new frequency. When the change is frequencies is small or is not a significant change in frequency then the bandwidth of the loop filter may not be increased or may not be increased as much as when there is a large or significant change in frequency to be made. Once the oscillator has moved to the new frequency, which may be estimated by the mere passage of time, or lock detection, or other criteria, then the bandwidth of the loop filter is decreased, in a continuous manner or in steps, in a linear or a non-linear manner, until the bandwidth of the loop filter is again at its lowest frequency, so that the response time is slow and the frequency of the VFO is stable.

Although the reference source 23 is described above as a crystal oscillator the present invention is not so limited. The reference source may be an incoming or received signal. For example, the reference source could be the output of IF amplifier 14. In this case the system would operate to cause the VFO frequency to be such that the IF frequency was at a desired frequency, such as the center of the IF passband.

Although use with an intermediate frequency system is described, the present invention is also useful with upconverter (sidestep) systems where the desired output of mixer 13 is at the sum frequency rather than at the difference (IF) frequency.

Figure 2:
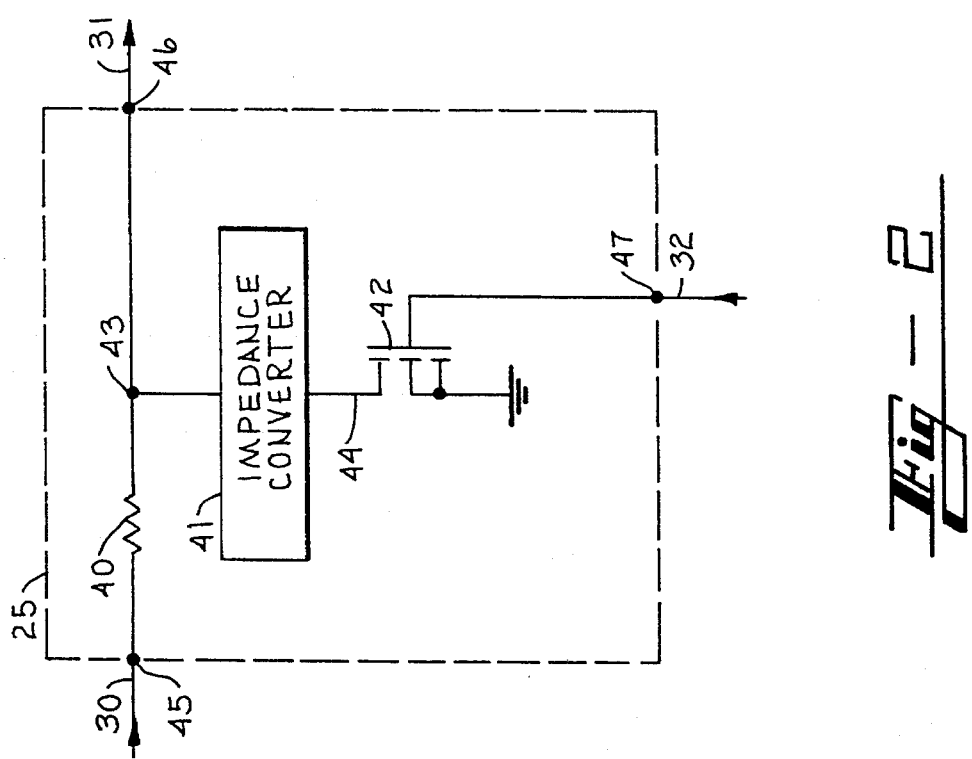
FIG. 2 is a schematic diagram of the preferred embodiment of the present invention.

Turn now to FIG. 2 which is a schematic diagram of the preferred embodiment of the present invention. Loop filter 25 comprises a resistor 40, an impedance converter 41, such as a generalized impedance converter(GIC), and a variable resistor 42, which is preferably implemented by a field effect transistor (FET). Input line 30 is connected via input terminal 45 to a first terminal of resistor 40. A second terminal of resistor 40 is connected to node 43 and to output line 31 via output terminal 46. Node 43 is also connected to a first terminal of impedance converter 41. A second terminal of impedance converter 41 is connected via line 44 and FET 42 to a signal return point, such as circuit ground. The response control signal on line 32 is applied to FET 42 via control terminal 47. FET 42 acts as a variable resistor, the resistance of which is controlled by the response control signal on line 32. Impedance converter 41 acts to convert the resistance presented by FET 42 into a capacitive reactance. As the response control signal on line 32 causes the resistance of FET 42 to vary, impedance converter 41 presents a corresponding variable capacitive reactance at node 43. Therefore, impedance converter 41 and FET 42 simulate a variable capacitor connected to node 43, the capacitance of which is controlled by the response control signal on line 32. Resistor 40 and the capacitor simulated by impedance converter 41 and FET 42 form a lowpass filter which has a variable time constant and a variable bandwidth.

If the control signal on line 32 is such as to cause FET 42 to have a large resistance then the effect will be as if a very small capacitor, having a large capacitive reactance, was present at node 43. This results in a small time constant and an increased bandwidth. Therefore, input signals on line 30 appearing at the input terminal 45 of loop filter 25 can cause a fast response at the output terminal 46 on line 31. When the time constant is small then the output voltage on line 31 can rapidly change so as to quickly force VFO 20 to the desired new oscillation frequency.

Conversely, if the control signal on line 32 is such as to cause FET 42 to have a low resistance then a simulated large capacitor, having a low capacitive reactance, will be present at node 43. This increases the time constant of loop filter 25 and therefore decreases the bandwidth of loop filter 25. Therefore, a changing signal at the input terminal 45 on line 30 will take longer to have an effect at the output terminal 46 on line 31. This provides for greater stability for VFO 20 because random noise variations are filtered out by loop filter 25 and therefore cause minimal or no change in the oscillation frequency of VFO 20.

It should be noted that the use of FET 42 and GIC 41 also provides for a smooth (if desired) transition from one capacitance value to another. That is, if the control signal on line 32 abruptly jumps then the capacitance value will change rapidly. If the change in the control signal on line 32 is slow, smooth, and/or linear then the capacitance value will change in the same manner. Therefore, the change in the filter 25 response time can be tailored to fit a particular requirement. For example, the preferred embodiment uses one of two values for FET 42 so as to provide for either a faster response time or a slower response time for filter 25.

Turn now to FIG. 3 which is a schematic diagram of the impedance converter 41 of the preferred embodiment. Node 43 is connected via a first terminal 60 to the non-inverting input of amplifier 62 and to one end of a chain of four series-connected impedances Z1–Z4. Line 44 is connected via a second terminal 61 to the non-inverting input of amplifier 63 and to the other end of the chain of series-connected impedances Z1–Z4. The output of amplifier 62 and impedances Z3 and Z4 are connected at node 64. The output of amplifier 63 and impedances Z1 and Z2 are connected at node 65. The inverting input of amplifier 62, the non-inverting input of amplifier 63, and impedances Z2 and Z3 are connected together at node 66.

The input impedance ZIN present at node 60 is:

$$ZIN = (Z1*Z3*ZF)/(Z2*Z4),$$

where ZF is the impedance presented by FET 42. If Z1, Z2, Z4 and ZF are all resistances (R) and Z3 is a capacitor (C), then:

$$ZIN = \frac{1}{S*((C3*R2*R4)/(R1*RF))}.$$

This represents an effective capacitance CIN at node 60 which is:

$$CIN = (C3*R2*R4)/(R1*RF).$$

Therefore, the value of resistor 40 and effective capacitance CIN cause loop filter 25 to have a time constant τ of:

$$\tau = ((C3*R2*R4*R40)/R1)*(1/RF).$$

The time constant, and therefore the response time, of loop filter 25 are inversely proportional to the resistance of FET 42 and so the bandwidth of loop filter 25 is proportional to the resistance of FET 42. Therefore, the response time of the phase-locked loop can be directly controlled by simply varying the input to FET 42. In the preferred embodiment, impedance Z1 has a resistance of 10 kohms, impedances Z2 and Z4 have resistances of 100 kohms, and impedance Z3 is a 100 pF capacitor. If RF is varied between 1 ohm and 10 kohms then the effective capacitance CIN will vary between 100 microfarads and 0.01 microfarads, respectively. Thus, large capacitance values can be readily simulated so as to obtain a low loop bandwidth and a slow time response, thereby providing for great stability. Also, it will be noted that the capacitor used for impedance Z3 is very small and may be fabricated as part of an integrated circuit whereas the simulated values for CIN are extremely large and, even if otherwise possible at all, would require a surface mount capacitor or other separate discrete capacitor. The present invention therefore provides an additional advantage in that the capacitor required for the loop filter is extremely small, has a wide capacitance range which may be electronically controlled, and may be fabricated as part of an integrated circuit.

Returning to FIG. 2, although the preferred environment of the present invention is in a phase-locked loop it will be appreciated that the present invention is not so limited. More particularly, as can be seen from FIG. 2, the present invention is a tunable lowpass filter which can simulate large capacitance values and large time constants, while using only an actual capacitance which is small enough to be fabricated as part of an integrated circuit. The filter represented by filter 25 may therefore be used in other filter applications, such as a lowpass filter for an automatic gain control circuit. In an automatic gain control circuit it is desirable to have a short time constant and high bandwidth for frequency modulated signals so as to rapidly compensate for changes in the strength of the incoming signal, and a longer time constant and low bandwidth for amplitude modulated signals so that the AGC circuit does not respond so rapidly as to cancel out the amplitude modulation caused by the desired incoming information.

Likewise, in an automatic frequency control circuit it is desirable to have a short time constant when changing channels so that the receiving device can rapidly lock to the frequency of the newly designated channel or signal and then change to a longer time constant once lock has been obtained so as to provide for stable reception and demodulation.

Figure 4:
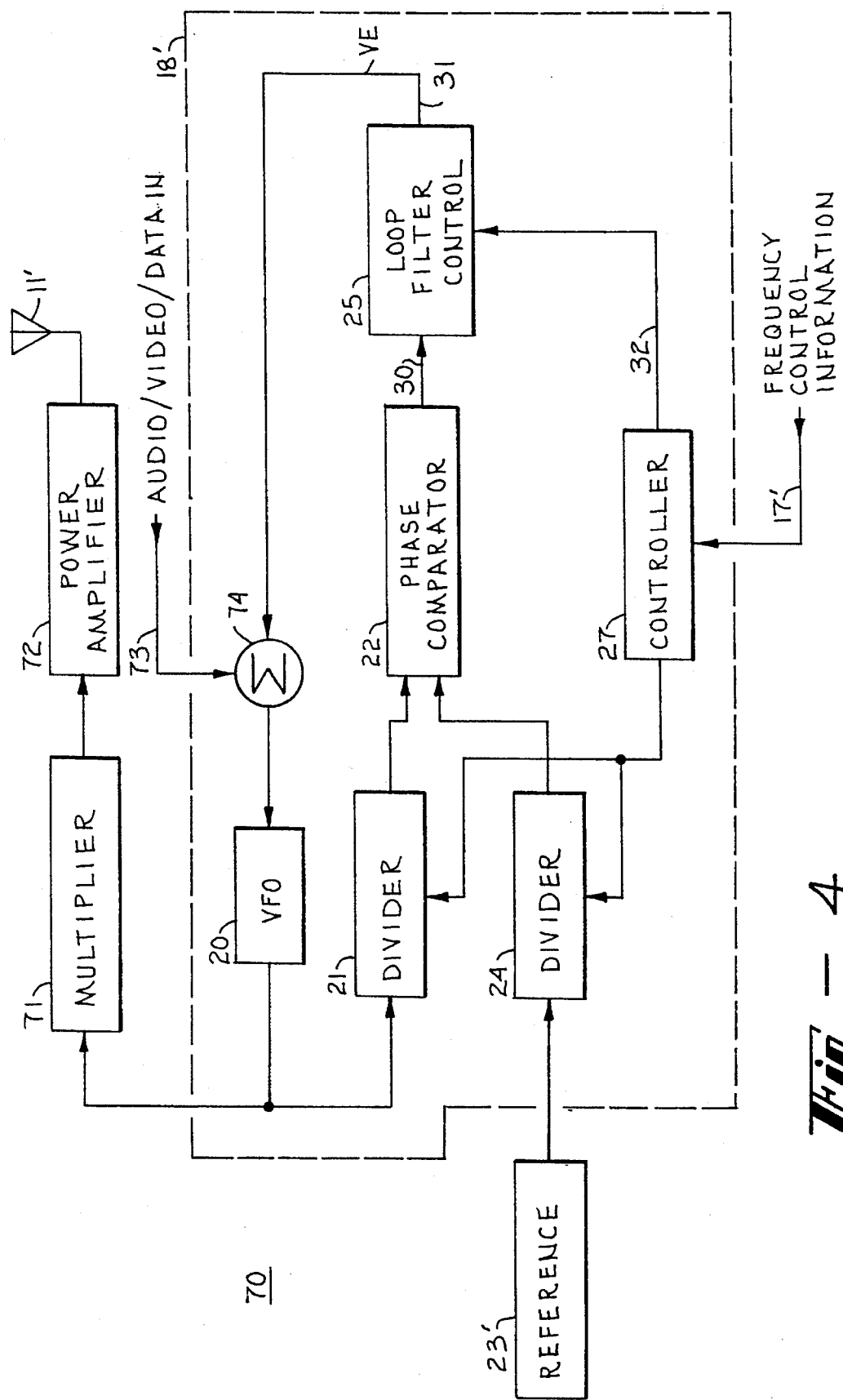
FIG. 4 is a block diagram of the present invention as used in a transmitter.

FIG. 4 is a block diagram of the present invention as used in a transmitter 70. Transmitter 70 comprises a transmitter phase-locked loop oscillator circuit 18', a frequency reference 23', a frequency multiplier 71, a power amplifier 72, and an antenna 11'. The transmitter oscillator circuit 18' is similar to the receiver oscillator circuit 18 but has an additional component, a summing amplifier 74, which is used to sum the error voltage on line 31 with the audio/video/data input modulation signal on line 73. If the modulation signal on line 73 is zero then the input to VFO 20 will be the same as the output VE of loop filter 25. Therefore, transmitter oscillator circuit 18' will perform in exactly the same manner as receiver oscillator circuit 18, described above. However, it is generally desirable to be able to modulate a signal for transmission so as to use the transmitted signal to convey information. In the preferred embodiment, frequency or phase modulation is used and is conveniently accomplished by providing a modulation signal via line 73 and summing amplifier 74 to the input of VFO 20. The audio/video/data modulation signal may therefore be used to modulate the phase or frequency of VFO 20. This modulation of the output of VFO 20 does cause a change in the output of phase comparator 22. However, the lowest frequency component of the modulation signal is preferably substantially above the highest bandwidth frequency of loop filter 25 so that loop filter 25 filters out the effects of the modulating signal and the output voltage VE of loop filter 25 is a result of the difference between the frequency of the reference 23' and the average frequency of the output of VFO 20.

In the environment of a transceiver, the same frequency reference 23, 23' may be used for both transmitting and receiving operations, the same antenna 11, 11' may be used for both transmitting and receiving operations, and a single controller 27 would control both the transmitter circuit 70 and the receiver circuit 10. In a half-duplex transceiver, the same oscillator circuit 18, 18' could be used for both transmitting and receiving operations.

Controller 27 receives frequency control information over line 17'. This frequency control information may be provided, as in the case of receiver 10, via user input or via a demodulated data output from detector circuit 15 of receiver 10.

FIG. 5 is a generalized implementation of the present invention. In this example, a function generator 81 is providing a specific output 82 which may be, for example, a desired speed in an automobile, a desired output voltage, a desired hydraulic pressure or vacuum, a desired position, etc. Devices which convert electric signals into specific output functions, such as cruise controls in automobiles, electric motors, vacuum pumps, pressure pumps, solenoids, etc., are well known. The output 82 of function generator 81 is connected to the input of a function measurement circuit 83. Function measurement circuit 83 converts some specific parameter into an electrical signal. Examples of function measurement circuit 83 are tachometers, speed dependent generators, pressure-to-voltage and vacuum-to-voltage transducers, position detectors, etc., all well known. The output of function measurement circuit 83 is provided via line 84 to one input of a comparator circuit 22'. A reference generator 85, which may be, for example, an oscillator or a digital-to-analog voltage or current converter, provides a reference output on line 86, which is connected to the other input of comparator 22'. Comparator 22' compares the signals at its inputs to determine the difference between these two signals. One example of comparator 22' is the phase comparator 22 of FIGS. 1 and 4. Other examples of a comparator 22' are an exclusive-OR circuit, an arithmetic subtraction circuit, and a differential amplifier. The type of device used for a comparator 22' will, of course, depend upon the nature of the signals provided to the inputs of the comparator 22'. The output of comparator 22' is provided over line 30' to the input of loop filter 25. The output of loop filter 25 is the error voltage VE and is provided over line 31 to the input of the function generator 81. A controller 27' provides a control output over line 32' to the control input of loop filter 25. As in the examples discussed in FIGS. 1 and 4, controller 27' can control the time constant (and therefore the response time and bandwidth) of loop filter 25. Another output of controller 27' on line 78 is provided to an input of reference generator 85 or to function measurement circuit 83 so as to allow controller 27' to change the desired operating point of function generator 81. As in the examples discussed above, user control or other input control may be provided to controller 27' via a control input 17'. Also, as with the examples above, when controller 27' causes a change to be made in the operating point of function generator 81, such as a change in motor speed or a change in position, as indicated by a change in the output of reference generator 85 or a change in an output scale factor of function measurement circuit 83, controller 27' will preferably change the response time of loop filter 25 so as to cause the output of loop filter 25 to respond rapidly to the difference between actual operation point of function generator 81 and the desired operating point. The function generator 81 will therefore be driven rapidly toward the new operating point. Then, controller 27' will cause loop filter 25 to decrease its response time, abruptly, slowly, linearly, non-linearly, or in steps, as desired or appropriate for the specific operation being performed. The function generator 81 will therefore assume a more stable output condition because the output of loop filter 25 will be more stable because loop filter 25 will have a slower response time. Therefore, in addition to the specific examples given above, it will be appreciated that the present invention is useful in controlling other types of functions wherein it is useful to have a loop filter with a variable response time.

The circuit of FIG. 2 can also be used to implement a highpass filter with a variable cutoff frequency. In this case, if component Z2 is a capacitor, and component Z3 is a resistor, then:

$$ZIN=S * RF * (C2 * R1 * R3/R4)$$

which represents an inductor. The circuit is thus a series R, shunt L, filter, which is a highpass filter and, as L is controllable, the cutoff frequency is controllable.

If the desired range of values or frequencies cannot be achieved with a single transistor then a wider range can be obtained by using two or more transistors, one as transistor 42, and others to replace one or more elements (Z1, Z2, Z3, Z4) of impedance converter 41. This approach is also useful with the circuits of FIGS. 6A and 6B.

Figure 6A:
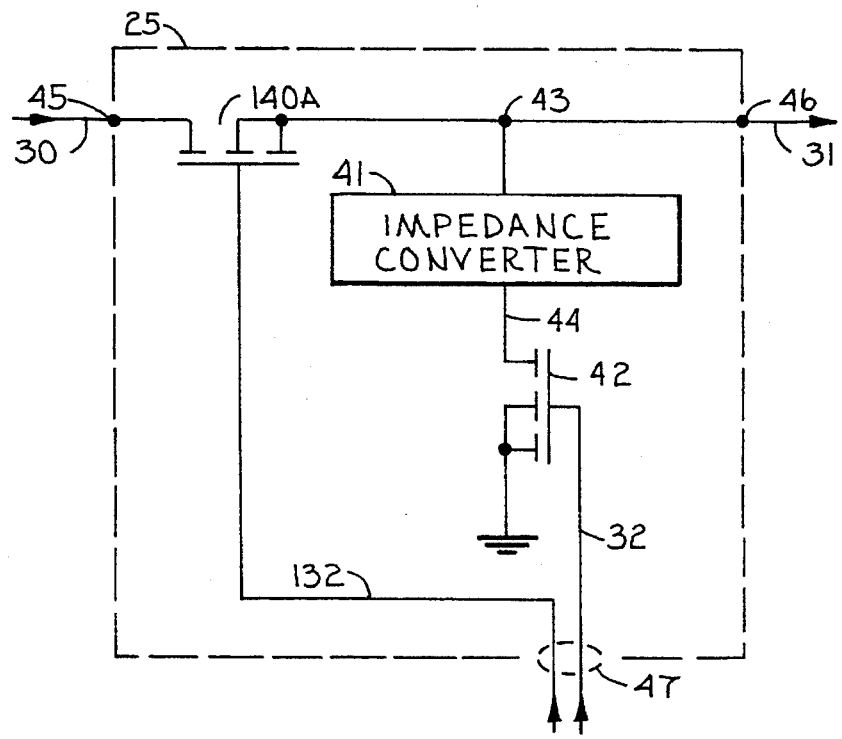
FIGS. 6A–6B are examples of other filter topologies which can be implemented using the present invention.
Figure 6B:
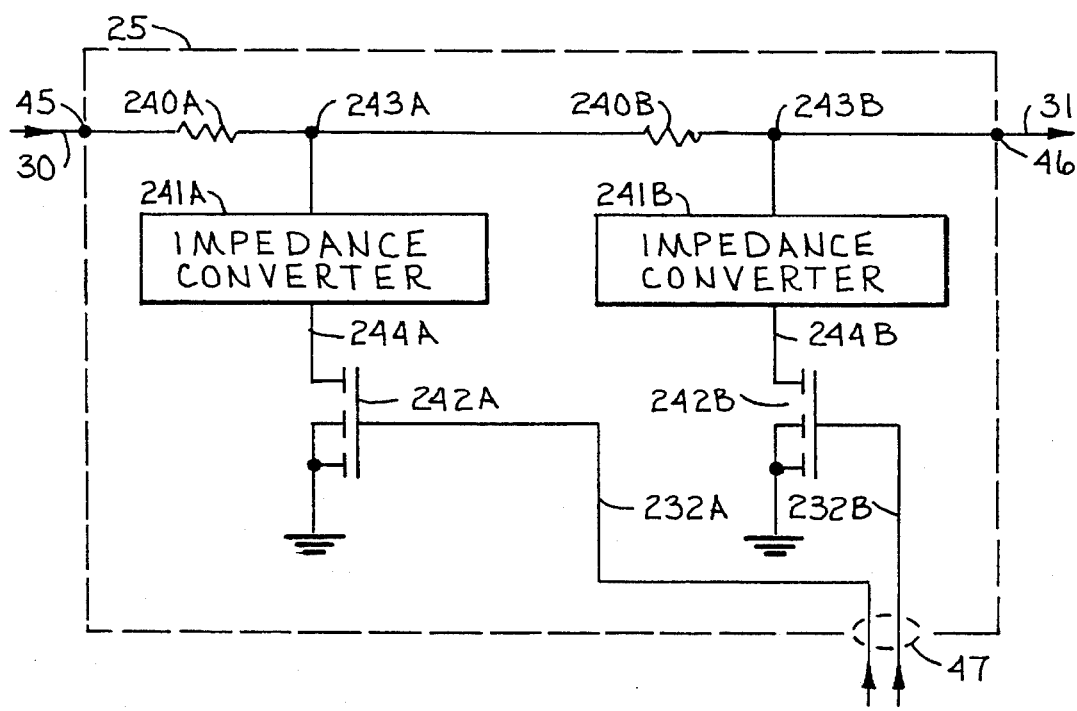

FIGS. 6A–6B are examples of other filter topologies which can be implemented using the present invention. FIG. 6A, like the first discussion of FIG. 2, is a lowpass filter. However, resistor 40 of FIG. 2 has been replaced with a variable resistor, such as a field effect transistor 140A. Therefore, both the resistance (represented by transistor 140A) and the capacitance (represented by impedance converter 41 and transistor 42) are variable, so that a wider range of frequency variation can be obtained. Transistor 140A is controlled, via line 132, by the controller 27 which controls transistor 42.

Where the transistor 140A is isolated from circuit ground then the output signal at node 43 should be small with respect to the control voltage on line 32. If the output voltage at node 43 is large then the gate-to-source voltage of the transistor 140A will not be solely a function of the control voltage on line 132, in which case the impedance of the transistor 140A, and therefore the bandwidth of the filter 25, will be a function of the output voltage as well as the control voltage.

The circuit of FIG. 6A, like the circuit of FIG. 2, can also be used to implement a highpass filter by appropriate selection of the components in impedance converter 41. In this case, both the series R and shunt L values may be varied to achieve the desired frequency range.

FIG. 6B is an example of a two-pole filter using the present invention. Line 30 is connected via node 45 and resistor 240A to node 243A. Node 243A is connected through resistor 240B to node 243B, node 46, and output line 31. Node 243A is also connected to one terminal of impedance converter 241A. The other terminal of impedance converter 241A is connected to the signal return via line 244A and transistor 242A. The control input (gate) of transistor 242A is connected to line 232A. Node 243B is connected to one terminal of impedance converter 241B. The other terminal of impedance converter 241B is connected to the signal return via line 244B and transistor 242B. The control input of transistor 242B is connected to line 232B. Lines 232A and 232B represent control lines from controller 27 via control node 47. It will be appreciated that impedance converter 241A and the transistor 242A represent a first shunt element, which may be an inductor or a capacitor, or desired, and impedance 241B and transistor 242B represent a second shunt element, which may be an inductor or a capacitor, as desired. Therefore, the circuit of FIG. 6B is a two-pole filter. Depending upon the selection of the shunt elements, the circuit may be a two-pole lowpass filter, a two-pole highpass filter, a bandpass filter, or a bandstop filter.

It will be appreciated that the circuits of FIG. 2 and FIG. 6B, and variations thereof such as FIG. 6A, may be combined to provide multiple-order, lowpass, bandpass, highpass, and bandstop filters, as desired for a particular application. Further, although the filter 25 is shown as a passive component, it will also be appreciated that the filter may be used as a tunable component in an active filter.

From the above description, other embodiments and uses for the present invention will suggest themselves to those of skill in the art. Therefore, the scope of the present invention is to be limited only by the claims below.

I claim:

1. A filter apparatus having a variable response time for filtering an input signal to provide a filtered output signal, comprising:

a resistor having a first terminal connected to said input signal and a second terminal for providing said filtered output signal;

a series circuit connected between said second terminal and a signal return point, said series circuit comprising a variable resistor connected in series with an impedance converter, said variable resistor having a control terminal and having a resistance responsive to a response control signal; and means for providing said response control signal to said control terminal of said variable resistor.

2. A phase-locked loop apparatus having a variable response time for use with a reference signal, comprising:

a variable frequency oscillator having an input for receiving an error signal, and an output for providing an oscillator signal having a frequency responsive to said error signal;

a phase comparator having a first input functionally connected to said reference signal, a second input functionally connected to said oscillator signal, and an output for providing a phase comparison signal;

means for providing a response control signal; and a filter having a variable cutoff frequency for filtering said phase comparison signal to provide said error signal, said filter comprising:

a resistor having a first terminal connected to said output of said phase comparator and a second terminal connected to said input of said variable frequency oscillator; and a series circuit connected between said second terminal and a signal return point, said series circuit comprising a variable resistor connected in series with an impedance converter, said variable resistor having a control terminal connected to said response control signal, and having a resistance responsive to said response control signal.

3. A receiver apparatus for processing a received signal, comprising:

a mixer having a first input functionally connected to said received signal and a second input functionally connected to an oscillator signal, and an output for providing an intermediate frequency (IF) signal responsive to said received signal and to said oscillator signal;

an amplifier connected to said output of said mixer and having an output for providing an amplified IF signal;

a detector connected to said output of said amplifier for demodulating said amplified IF signal to provide a demodulated output signal;

an oscillator for providing a reference signal;

a variable frequency oscillator having an input for receiving an error signal and an output for providing said oscillator signal, said oscillator signal having a frequency responsive to said error signal;

a phase comparator having a first input functionally connected to said reference signal, a second input functionally connected to said oscillator signal, and an output for providing a phase comparison signal;

means for providing a response control signal; and a filter having a variable cutoff frequency for filtering said phase comparison signal to provide said error signal, said filter comprising:

a resistor having a first terminal connected to said output of said phase comparator and a second terminal connected to said input of said variable frequency oscillator; and a series circuit connected between said second terminal and a signal return point, said series circuit comprising a variable resistor connected in series with an impedance converter, said variable resistor having a control terminal connected to said response control signal, and having a resistance responsive to said response control signal.

4. A transmitter apparatus for providing a transmit signal, comprising:

an oscillator for providing a reference signal;

a variable frequency oscillator having an input for receiving an error signal and an output for providing an oscillator signal, said oscillator signal having a frequency responsive to said error signal;

means for processing said oscillator signal to provide said transmit signal;

a phase comparator having a first input functionally connected to said reference signal, a second input functionally connected to said oscillator signal, and an output for providing a phase comparison signal;

means for providing a response control signal; and a filter having a variable cutoff frequency for filtering said phase comparison signal to provide said error signal, said filter comprising:

a resistor having a first terminal connected to said output of said phase comparator and a second terminal connected to said input of said variable frequency oscillator; and a series circuit connected between said second terminal and a signal return point, said series circuit comprising a variable resistor connected in series with an impedance converter, said variable resistor having a control terminal connected to said response control signal, and having a resistance responsive to said response control signal.

5. An apparatus for providing a predetermined function, comprising:

a reference generator for providing a reference signal;

a function generator having an input for receiving an error signal and an output for providing said predetermined function, said predetermined function having a characteristic responsive to said error signal;

a function measurement circuit having an input functionally connected to said output of said function generator, and an output for providing a function measurement signal responsive to said characteristic of said predetermined function;

a comparator having a first input functionally connected to said reference signal, a second input functionally connected to said function measurement signal, and an output for providing a comparison signal;

means for providing a response control signal; and a filter having a variable cutoff frequency for filtering said comparison signal to provide said error signal, said filter comprising:

a resistor having a first terminal connected to said output of said comparator and a second terminal connected to said input of said function generator; and a series circuit connected between said second terminal and a signal return point, said series circuit comprising a variable resistor connected in series with an impedance converter, said variable resistor having a control terminal connected to said response control signal, and having a resistance responsive to said response control signal.

6. The apparatus of claim 3 wherein said means for providing said response control signal comprises a controller connected to said detector and responsive to information contained in said demodulated output signal for providing said response control signal.

7. The apparatus of claim 6 and further comprising a frequency divider connected between said output of said oscillator and said first input of said phase comparator, and wherein said controller is further responsive to said information for adjusting a divide ratio provided by said frequency divider.

8. The apparatus of claim 6 and further comprising a frequency divider connected between said output of said variable frequency oscillator and said second input of said phase comparator, and wherein said controller is further responsive to said information for adjusting a divide ratio provided by said frequency divider.

9. The apparatus of claim 6 wherein said information specifies a change in an operating channel for said apparatus and wherein said controller is responsive to said change exceeding a predetermined value for causing said variable resistor to change said resistance.

10. The apparatus of claim 2, 3, or 4 and further comprising a frequency divider connected between said reference signal and said first input of said phase comparator for providing a reduced frequency reference signal to said first input of said phase comparator.

11. The apparatus of claim 2, 3, or 4 and further comprising a frequency divider connected between said oscillator signal and said second input of said phase comparator for providing a reduced frequency oscillator signal to said second input of said phase comparator.

12. The apparatus of claim 1, 2, 3, 4, or 5 wherein said variable resistor comprises a field effect transistor.

13. The apparatus of claim 12 wherein said means for providing said control signal also provides a second control signal, and wherein said resistor having said first terminal is a variable resistor having a control terminal connected to said second control signal, and having a resistance responsive to said second control signal.

14. The apparatus of claim 13 wherein said resistor having said first terminal is a second field effect transistor.

* * * * *